US012644181B2

United States Patent
(12) United States Patent
Yeom et al.

(10) Patent No.: US 12,644,181 B2
(45) Date of Patent: Jun. 2, 2026

(54) COMPOSITION, PRECURSOR COMPOSITION INCLUDING SAME, AND METHOD OF MANUFACTURING THIN FILM USING SAME PRECURSOR COMPOSITION

(71) Applicant: Hansol Chemical Co., Ltd, Seoul (KR)

(72) Inventors: Kyu-Hyun Yeom, Wanju-gun (KR); Ki-Yeung Mun, Wanju-gun (KR); Dae-Won Ryu, Wanju-gun (KR); Jang-Hyeon Seok, Sejong-si (KR)

(73) Assignee: Hansol Chemical Co., Ltd., Seoul (KR)

( * ) Notice: Subject to any disclaimer, the term of this patent is extended or adjusted under 35 U.S.C. 154(b) by 0 days.

(21) Appl. No.: 18/810,240

(22) Filed: Aug. 20, 2024

(65) Prior Publication Data

US 2025/0066914 A1 Feb. 27, 2025

(30) Foreign Application Priority Data

Aug. 22, 2023 (KR) ........................ 10-2023-0109807

(51) Int. Cl.
*C23C 16/455* (2006.01)
*C07F 5/00* (2006.01)
*C23C 16/18* (2006.01)

(52) U.S. Cl.
CPC .......... *C23C 16/45553* (2013.01); *C07F 5/00* (2013.01); *C23C 16/18* (2013.01)

(58) Field of Classification Search
CPC .............. C23C 16/45553; C23C 16/18; C23C 16/45531; C23C 16/045; C23C 16/407; C23C 16/303; C23C 16/405; C07F 5/00; H01L 21/02175; H01L 21/02565; H01L 21/0262; H01L 21/02205; H01L 21/0228
See application file for complete search history.

(56) References Cited

U.S. PATENT DOCUMENTS 5,235,078 A * 8/1993 Pohl ...................... C23C 16/301 556/27
2020/0392171 A1 12/2020 Sundermeyer et al.
2022/0123131 A1 4/2022 Madia et al.

FOREIGN PATENT DOCUMENTS

EP 4053131 A1 * 9/2022 ....... C23C 16/45553
JP H03190884 A 8/1991
JP 2004527651 A 9/2004
(Continued)

OTHER PUBLICATIONS

Carta, Giovanni, et al. "A comparison of the mass spectrometric behaviour of trimethylindium adducts with N, N, N'—triathylethylenediamines and of the related dimethylindium N, N, N'—trialkylethylenediamido derivatives." Rapid Communications in Mass Spectrometry 8.4 (1994): 299-303.

*Primary Examiner* — Michael G Miller
(74) *Attorney, Agent, or Firm* — Cognition IP, P.C.; Edward Steakley

(57) ABSTRACT

Proposed is a vapor deposition precursor composition that enables thin film deposition through vapor deposition. Specifically, proposed is a novel composition applicable to atomic layer deposition (ALD) or chemical vapor deposition (CVD), in which the novel composition having excellent reactivity, volatility, and thermal stability, a precursor composition containing the novel composition. Additionally, a method of manufacturing a thin film using the precursor composition is proposed.

9 Claims, 10 Drawing Sheets

(56) References Cited

FOREIGN PATENT DOCUMENTS

| | | | |
|---|---|---|---|
| JP | 2009544842 | A | 12/2009 |
| JP | 2021517905 | A | 7/2021 |
| JP | 2022522182 | A | 4/2022 |
| JP | 2022089772 | A | 6/2022 |
| JP | 2022554122 | A | 12/2022 |
| JP | 2023522043 | A | 5/2023 |
| KR | 20180056949 | A | 5/2018 |
| KR | 20210093011 | A | 1/2020 |
| KR | 20200116839 | A | 10/2020 |
| KR | 10-2023-0074580 | A | 5/2023 |
| WO | 2022266449 | A1 | 12/2022 |

* cited by examiner

| O 1s | | |
|---|---|---|
| O-Metal(%) | O-deficiency(%) | O-H(%) |
| 86.8 | 4.3 | 8.9 |

| Composition (atom%) | | | | | | Oxygen /metal ratio |
|---|---|---|---|---|---|---|
| In | Ga | O | C | N | In:Ga | |
| 33.9 | 10.5 | 55.6 | N/A | N/A | 3.2 : 1 | 1.25 |

| | Phase |
|---|---|
| 100°C | Nanocrystalline |
| 280°C | Polycrystalline |

| | Thickness(Å) | Density(g/cm3) | Roughness(Å) |
|---|---|---|---|
| 100°C | 205 | 6.18 | 6.31 |
| 280°C | 234 | 6.88 | 8.85 |

COMPOSITION, PRECURSOR COMPOSITION INCLUDING SAME, AND METHOD OF MANUFACTURING THIN FILM USING SAME PRECURSOR COMPOSITION

CROSS REFERENCE TO RELATED APPLICATIONS

The present application claims priority to Korean Patent Application No. 10-2023-0109807, filed Aug. 22, 2023, the entire contents of which is incorporated herein for all purposes by this reference.

BACKGROUND OF THE DISCLOSURE

1. Field of the Disclosure

The present disclosure relates to a novel composition for forming a thin film through vapor deposition, to a precursor composition including the novel composition, and to a method of manufacturing a thin film using the precursor composition.

2. Description of the Related Art

As semiconductor devices undergo continuous downscaling and increasing integration density, it becomes important to uniformize the thickness of metal and metal oxide thin films for application to various technologies such as microelectronics, magnetic information storage, and catalysts.

Chemical vapor deposition (CVD) or atomic layer deposition (ALD) is used to manufacture a metal thin film and metal oxide thin film. In particular, the ALD technology involves sequentially injecting reactants into a chamber and removing the reactants. Thus, by the method, a desired thin film may be formed, the composition of a thin film formed is easy to control, and a thin film with a uniform thickness can be formed. In addition, ALD allows for excellent step coverage and enables thin films to be grown uniformly on complex and sophisticated devices.

To manufacture a thin film through ALD, a precursor plays an important role. Moreover, high volatility, high thermal stability, and high reactivity of the precursor within a chamber are required. To date, precursor development has been in progress with the use of various ligands. Representative ligands include halogen, alkoxide, cyclopentadiene, beta-diketonate, amide, and amidinate. However, most known precursors are solid compounds, have low volatility or stability, or may cause problems such as film contamination with impurities during thin film deposition. Thus, there is a need to develop a new precursor with excellent properties that address the disadvantages.

In particular, silicon dioxide ($SiO_2$) has been used as a gate dielectric material for transistors so far. However, recently, as the size of semiconductor devices has become increasingly smaller, the problems of tunneling current leakage and subsequent increase in power dissipation and heat generation have become serious. Accordingly, the need to develop a new material with a high dielectric constant to replace $SiO_2$ dielectric has emerged. Oxide semiconductors have emerged as strong candidates and research thereon is actively underway.

Indium gallium oxide (IGO) is a ternary n-type oxide semiconductor. Indium gallium oxide (IGO) has good channel mobility and excellent light transmittance, so indium gallium oxide (IGO) may be suitably used in transparent thin film transistors (TFTs). In addition, indium gallium oxide shows second-order changes in resistance values between an amorphous structure exhibiting a high resistance value and a cubic structure exhibiting a low resistance value. Because of these properties, indium gallium oxide is considered a suitable material for low-power phase change memory (PCM) devices.

RELATED ART DOCUMENT

Patent Document (Patent document 1) Korean Patent Application Publication No. 2023-0074580

SUMMARY OF THE DISCLOSURE

The present disclosure is to provide a novel composition applicable to atomic layer deposition (ALD) or chemical vapor deposition (CVD), and a precursor composition including the novel composition.

In particular, the present disclosure is to provide a precursor composition, which is liquid, has excellent thermal stability and volatility, is excellent for application in ALD, has almost no impurities, allows for thin film deposition with excellent step coverage, and enables uniform thin film deposition over a wide temperature range.

Additionally, the present disclosure is to provide a method of manufacturing a thin film using the precursor composition.

However, the problem to be solved by the present disclosure is not limited to the problems mentioned above, and other problems not mentioned may be clearly understood by those skilled in the art from the description below.

One aspect of the present disclosure provides a composition including a first compound represented by Formula 1 below and a second compound represented by Formula 2 below:

[Formula 1]

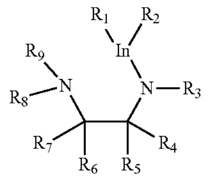

In Formula 1 above,

- $R_1$ and $R_2$ are each independently hydrogen, a linear or branched hydrocarbon group having 1 to 4 carbon atoms, $OR_{10}$, or $NR_{11}R_{12}$;
- $R_3$, $R_8$, and $R_9$ are each independently hydrogen or a linear or branched hydrocarbon group having 1 to 6 carbon atoms;
- $R_4$ to $R_7$ are each independently hydrogen or a linear or branched hydrocarbon group having 1 to 3 carbon atoms; and
- $R_{10}$ to $R_{12}$ are each independently hydrogen or a linear or branched hydrocarbon group having 1 to 3 carbon atoms.

[Formula 2]

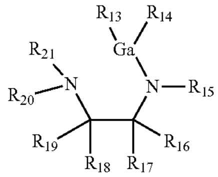

In Formula 2 above, $R_{13}$ and $R_{14}$ are each independently hydrogen, a linear or branched hydrocarbon group having 1 to 4 carbon atoms, $OR_{22}$, or $NR_{23}R_{24}$;

$R_{15}$, $R_{20}$, and $R_{21}$ are each independently hydrogen or a linear or branched hydrocarbon group having 1 to 6 carbon atoms;

$R_{16}$ to $R_{19}$ are each independently hydrogen or a linear or branched hydrocarbon group having 1 to 3 carbon atoms; and $R_{22}$ to $R_{24}$ are each independently hydrogen or a linear or branched hydrocarbon group having 1 to 3 carbon atoms.

Another aspect of the present disclosure provides a vapor deposition precursor composition, the precursor composition including the composition.

Yet another aspect of the present disclosure provides a method of manufacturing a thin film, the method including introducing the vapor deposition precursor composition into a chamber.

The composition according to the present disclosure is a liquid, is excellent for application in ALD, and enables uniform thin film deposition. Accordingly, it is possible to secure a thin film with almost no impurities and excellent step coverage properties.

The physical properties of the composition allow a precursor suitable for application in ALD and CVD.

In addition, the thin film deposited using the composition of the present disclosure is expected to be used as an active layer of an oxide thin film transistor (TFT) in display devices in the future and to be used as a channel in the manufacturing of memory semiconductors.

DESCRIPTION OF THE PREFERRED EMBODIMENTS

Figure 1A:
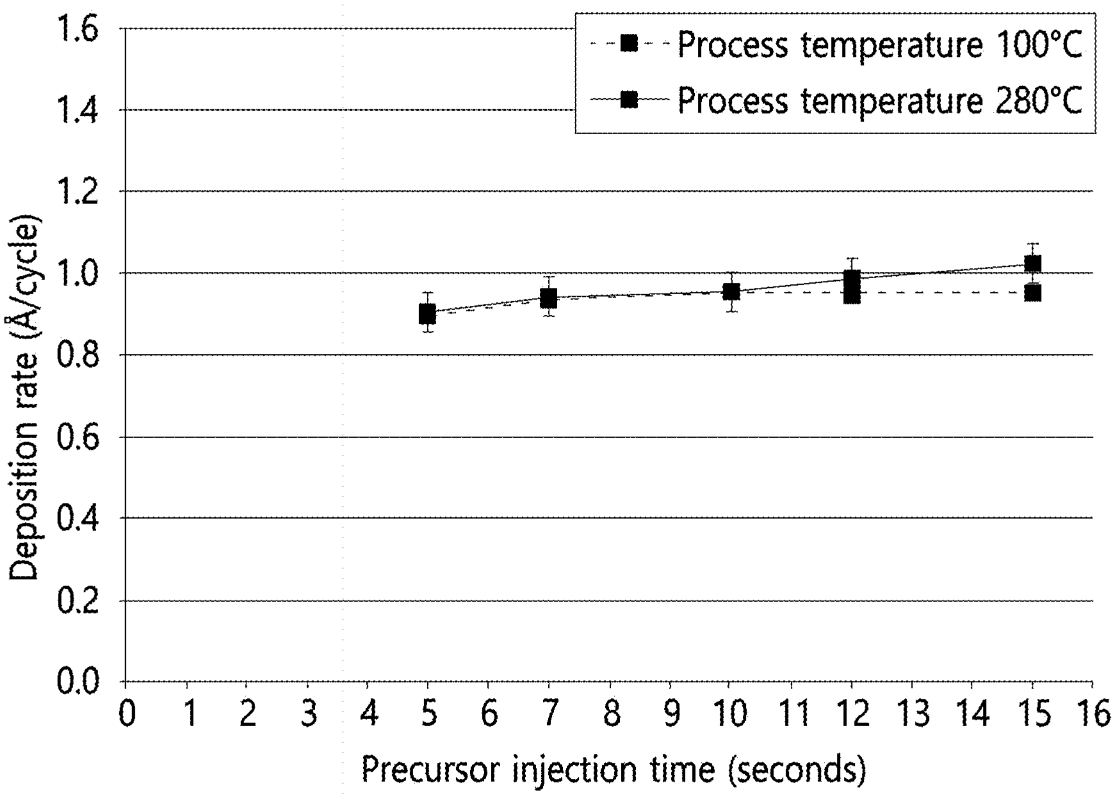
FIG. 1A is a graph showing a change in deposition rate depending on a change in precursor injection time in manufacturing the indium gallium oxide film of Preparation Example 1 of the present disclosure.

Hereinafter, the operation and effects of the disclosure will be described in more detail through specific embodiments of the disclosure. However, these embodiments are merely presented as embodiments of the disclosure, and the scope of the disclosure is not determined by the embodiments.

Prior to this, terms and words used in this specification and claims should not be construed as limited to their usual or dictionary meanings. Based on the principle that the inventors may appropriately define the concept of the terms to explain his or her disclosure in the best way, the terms and words are required to be interpreted as meanings and concepts consistent with the technical idea of the present disclosure.

Accordingly, the configuration of the embodiments described in this specification is only one of the most preferred embodiments of the present disclosure and does not represent the entire technical idea of the present disclosure. Thus, it should be understood that at the time of filing this application, there may be various equivalents and modifications that may replace the configuration of the embodiments.

In this specification, singular expressions include plural expressions, unless the context clearly dictates otherwise. In this specification, terms such as "include", "comprise", or "have" are intended to indicate the presence of implemented features, numbers, steps, components, or combinations thereof. The words are required to be understood as not excluding in advance the presence or addition of one or more other features, numbers, steps, elements, or combinations thereof.

In one aspect of the present disclosure, a composition may include a first compound represented by Formula 1 below and a second compound represented by Formula 2 below.

[Formula 1]

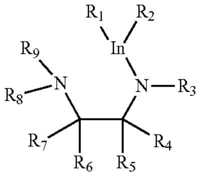

In Formula 1 above, $R_1$ and $R_2$ are each independently hydrogen, a linear or branched hydrocarbon group having 1 to 4 carbon atoms, $OR_{10}$, or $NR_{11}R_{12}$;

$R_3$, $R_8$, and $R_9$ are each independently hydrogen or a linear or branched hydrocarbon group having 1 to 6 carbon atoms;

$R_4$ to $R_7$ are each independently hydrogen or a linear or branched hydrocarbon group having 1 to 3 carbon atoms; and $R_{10}$ to $R_{12}$ are each independently hydrogen or a linear or branched hydrocarbon group having 1 to 3 carbon atoms.

[Formula 2]

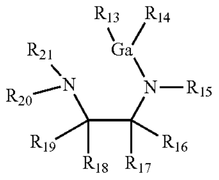

In Formula 2 above, $R_{13}$ and $R_{14}$ are each independently hydrogen, a linear or branched hydrocarbon group having 1 to 4 carbon atoms, $OR_{22}$, or $NR_{23}R_{24}$;

$R_{15}$, $R_{20}$, and $R_{21}$ are each independently hydrogen or a linear or branched hydrocarbon group having 1 to 6 carbon atoms;

$R_{16}$ to $R_{19}$ are each independently hydrogen or a linear or branched hydrocarbon group having 1 to 3 carbon atoms; and $R_{22}$ to $R_{24}$ are each independently hydrogen or a linear or branched hydrocarbon group having 1 to 3 carbon atoms.

In one embodiment of the present disclosure, preferably, $R_1$, $R_2$, $R_{13}$, and $R_{14}$ may each independently include any one selected from the group consisting of hydrogen, methyl group, ethyl group, n-propyl group, iso-propyl group, n-butyl group, iso-butyl group, sec-butyl group, tert-butyl group, OH group, OMe group, OEt group, O$^{n}$Pr group, O$^{i}$Pr group, $NH_2$ group, NHMe group, NHEt group, NH$^{n}$Pr group, NH$^{i}$Pr group, $NMe_2$ group, NMeEt group, NMe$^{n}$Pr group, NMe$^{i}$Pr group, $NEt_2$ group, NEt$^{n}$Pr group, NEt$^{i}$Pr group, N$^{n}$Pr$_2$ group, N$^{n}$Pr$^{i}$Pr group, and N$^{i}$Pr$_2$ group. The Me is methyl, the Et is ethyl, the $^{n}$Pr is n-propyl, and the $^{i}$Pr is iso-propyl.

More preferably, $R_1$, $R_2$, $R_{13}$, and $R_{14}$ may each independently include any one selected from the group consisting of hydrogen, methyl group, ethyl group, n-propyl group, and iso-propyl group, but are not limited thereto.

More preferably, $R_1$, $R_2$, $R_{13}$, and $R_{14}$ may include the methyl group.

In another embodiment of the present disclosure, preferably $R_3$, $R_8$, $R_9$, $R_{15}$, $R_{20}$, and $R_{21}$ may each independently include any one selected from the group consisting of hydrogen, methyl group, ethyl group, n-propyl group, iso-propyl group, n-butyl group, iso-butyl group, sec-butyl group, tert-butyl group, n-pentyl group, iso-pentyl group, neo-pentyl group, sec-pentyl group, tert-pentyl group, hexyl group, and iso-hexyl group, and isomers thereof.

More preferably, $R_3$, $R_8$, $R_9$, $R_{15}$, $R_{20}$, and $R_{21}$ may include any one selected from the group consisting of hydrogen, methyl group, ethyl group, n-propyl group, iso-propyl group, n-butyl group, iso-butyl group, sec-butyl group, tert-butyl group but are not limited thereto.

More preferably, $R_3$ and $R_{15}$ may include the tert-butyl group, and $R_8$, $R_9$, $R_{20}$, and $R_{21}$ may include the methyl group.

In yet another embodiment of the present disclosure, preferably, $R_4$ to $R_7$ and $R_{16}$ to $R_{19}$ may each independently include any one selected from the group consisting of hydrogen, methyl group, ethyl group, n-propyl group, and iso-propyl group.

More preferably, $R_4$ to $R_7$ and $R_{16}$ to $R_{19}$ may each independently include any one selected from the group consisting of hydrogen, methyl group, and ethyl group but are not limited thereto.

More preferably, $R_4$ to $R_7$ and $R_{16}$ to $R_{19}$ may include the hydrogen.

In yet another embodiment of the present disclosure, preferably, $R_{10}$ to $R_{12}$ and $R_{22}$ to $R_{24}$ may each independently include any one selected from the group consisting of hydrogen, methyl group, ethyl group, n-propyl group, and iso-propyl group.

In yet another embodiment of the present disclosure, the first compound and the second compound included in the composition may have a molar ratio in a range of 1:1 to 5:1. For example, the first compound and the second compound may have a molar ratio of 1:1 to 5:1, 1.5:1 to 4.5:1, 1.8:1 to 4.2:1, or 2:1 to 4:1.

When the molar ratio of the first compound and the second compound is outside the ranges specified herein, it may be difficult to form a thin film with the desired atomic ratio when depositing the thin film.

In yet another embodiment of the present disclosure, the composition including the first compound and the second compound may be liquid at room temperature. Additionally, the composition has a low melting point and excellent volatility at low temperatures.

A vapor deposition precursor composition according to another aspect of the present disclosure may include any one of the compositions.

A method of manufacturing a thin film according to yet another aspect of the present disclosure may include introducing the vapor deposition precursor composition into a chamber.

In yet another embodiment of the present disclosure, the introducing of the vapor deposition precursor composition into a chamber may include physical adsorption, chemical adsorption, or physical and chemical adsorption.

In yet another embodiment of the present application, the method of manufacturing the thin film may include both atomic layer deposition (ALD) and chemical vapor deposition (CVD).

More specifically, the deposition methods may include metal organic chemical vapor deposition (MOCVD), low pressure chemical vapor deposition (LPCVD), pulsed chemical vapor deposition (P-CVD), and plasma enhanced atomic layer deposition (PE-ALD), or combinations thereof.

The method of manufacturing the thin film is preferably ALD but is not limited thereto.

In ALD, reactants are required to be highly volatile, materials are required to be stable, and reactivity is required to be high. ALD is a method of supplying reaction raw materials separately. During one cycle of deposition, a thin film of a monolayer or less is grown due to surface reaction. The ligand of the reaction raw materials adsorbed on the substrate is removed through a chemical reaction with other reaction raw materials supplied later. In the case of heating a precursor composition as a reactant for ALD, when the precursor composition is in the liquid phase, it may be much more advantageous in reaction speed and process than when the precursor composition is in the solid phase.

In yet another embodiment of the present disclosure, the method of manufacturing the thin film may further include injecting a compound (or mixture) containing an oxygen (O) atom as a reaction gas.

Specifically, an oxide thin film may be deposited using one or more selected from the group consisting of water vapor ($H_2O$), hydrogen peroxide vapor ($H_2O_2$), oxygen ($O_2$), a mixture of oxygen and hydrogen ($O_2$+$H_2$), and ozone ($O_3$) as a reaction gas but the type of the reaction gas is not limited thereto.

In yet another embodiment of the present disclosure, when the method of manufacturing a thin film is ALD, the method may include a first purging which involves purging the precursor composition from the chamber before the injection of the reaction gas and/or may include a second purging which involves purging by-products that do not react or are generated by reaction with the precursor composition after the injection of the reaction gas.

The purging helps the movement of the precursor on the substrate, ensures that the inside of the reactor has an appropriate pressure for deposition, and also discharges impurities present in the reactor to the outside. That is, a process of purging an inert gas such as argon (Ar), nitrogen ($N_2$), or helium (He) within the reactor may be additionally performed before and after supplying the reaction gas.

In yet another embodiment of the present disclosure, a process temperature by the method of manufacturing a thin film may be in a range of 50° C. or higher and 500° C. or lower.

For example, the process temperature may be in a range of 60° C. or higher and 480° C. or lower, 70° C. or higher and 460° C. or lower, 80° C. or higher and 440° C. or lower, and 90° C. or higher and 420° C. or lower. The process temperature may preferably be in a range of 100° C. or higher and 400° C. or lower.

When the process temperature is below the ranges specified herein, the reaction rate may not be sufficient, and the deposition rate may slow down, resulting in poor deposition. When the process temperature is beyond the ranges specified herein, the reaction rate may be too fast, resulting in impurity generation. Alternatively, at the process temperature beyond the ranges, the precursor or reaction gas may be decomposed, resulting in an improper deposition. Thus, a thin film may be difficult to form.

In yet another embodiment of the present disclosure, ALD window (a temperature range in which the deposition rate is constant regardless of the process temperature) may be in a range of 100° C. or higher and 400° C. or lower by the method of manufacturing a thin film specified herein, the method including introducing a vapor deposition precursor composition into the chamber.

For example, the ALD window may be in a range of 100° C. or higher and 370° C. or lower, 100° C. or higher and 340° C. or lower, 100° C. or higher and 310° C. or lower, or 100° C. or higher and 280° C. or lower.

In yet another embodiment of the present disclosure, when a thin film is deposited by the method of manufacturing a thin film specified herein at a process temperature in a range of 100° C. or higher to 400° C. or lower, the deposition rate may be in a range of 0.80 Å/cycle or more and 1.55 Å/cycle or less.

For example, in a process temperature range of 100° C. or higher and 400° C. or lower, a thin film deposition rate by the method of manufacturing a thin film specified herein may be in a range of 0.85 Å/cycle or more and 1.50 Å/cycle or less, 0.90 Å/cycle or more and 1.46 Å/cycle or less, 0.91 Å/cycle or more and 1.02 Å/cycle or less, 0.93 Å/cycle or more and 0.96 Å/cycle or less, 0.94 Å/cycle or more and 1.01 Å/cycle or less, 0.90 Å/cycle or more and 0.95 Å/cycle or less, 0.82 Å/cycle or more and 0.99 Å/cycle or less, and 1.06 Å/cycle or more and 1.46 Å/cycle or less.

In yet another embodiment of the present disclosure, the canister temperature by the method of manufacturing a thin film may be in a range of 30° C. or higher and 100° C. or lower.

For example, the canister temperature may be in a range of 35° C. or higher and 95° C. or lower, 40° C. or higher and 90° C. or lower, 45° C. or higher and 85° C. or lower, 50° C. or higher and 80° C. or lower, 55° C. or higher and 75° C. or lower, 60° C. or higher and 70° C. or lower, 30° C., 40° C., 50° C., 60° C., 70° C., 80° C., 90° C., and 100° C. The canister temperature may preferably be 65° C.

A canister is used to supply source gas into a chamber for reaction in the method of manufacturing a thin film. Typically, the canister vaporizes a precursor composition to generate source gas and then supplies the source gas into a chamber.

When the canister has a temperature of less than 30° C. or more than 100° C., the thickness uniformity of the thin film manufactured by the method of manufacturing a thin film may be greatly reduced. This may be because the amount of precursor composition supplied to the chamber is insufficient at a temperature less than 30° C. In addition, this may be because the precursor composition is decomposed due to heat energy, or the precursor composition is excessively supplied to the chamber at a temperature of more than 100° C. Thus, it is difficult to obtain uniform membrane quality.

In yet another embodiment of the present disclosure, the injection time of the precursor composition may be in a range of 1 second or more and 30 seconds or less, and the injection amount of precursor composition carrier gas may be in a range of 10 sccm or more and 1000 sccm or less.

For example, the injection time of the precursor composition may be in a range of 1 second or more and 27 seconds or less, 2 seconds or more and 24 seconds or less, 3 seconds or more and 21 seconds or less, 4 seconds or more and 18 seconds or less, and 5 seconds or more and 15 seconds or less.

A purge gas injection amount in the first purging may be in a range of 20 sccm or more and 800 sccm or less, 40 sccm or more and 700 sccm or less, 60 sccm or more and 600 sccm or less, 80 scm or more and 500 sccm or less, 100 sccm or more and 450 sccm or less, 150 sccm or more and 400 sccm or less, and 250 sccm or more and 350 sccm or less.

When the process is performed beyond or below the ranges, it may be difficult to form an appropriate thin film.

Specifically, when the injection time of the precursor composition is below the ranges specified herein, a thin film of appropriate thickness may not be formed due to a lack of reactants necessary for manufacturing a thin film. On the other hand, when the injection time of the precursor composition is beyond the ranges specified herein, the composition ratio of the prepared thin film may be inconsistent due to impurities from residual compounds after the reactions.

In addition, when the injection amount of the precursor composition carrier gas is below the ranges specified herein, the remaining amount of the precursor composition, which is a reactant, may increase, thereby an inappropriate reaction may occur, and impurities may not be purged. Thus, a thin film layer may be deposited non-uniformly.

In yet another embodiment of the present disclosure, a reaction gas injection time may be in a range of 1 second or more and 30 seconds or less, and a reaction gas injection amount may be in a range of 50 sccm or more and 3000 sccm or less.

For example, the reaction gas injection time may be in a range of 2 seconds or more and 27 seconds or less, 3 seconds or more and 24 seconds or less, 4 seconds or more and 21 seconds or less, 5 seconds or more and 19 seconds or less, 6 seconds or more and 17 seconds or less, and 7 seconds or more and 15 seconds or less.

In addition, the reaction gas injection amount may be, for example, in a range of 100 sccm or more and 2500 sccm or less, 300 sccm or more and 2000 sccm or less, 500 sccm or more and 1500 sccm or less, 700 sccm or more and 1300 sccm or less, and 900 sccm or more and 1100 sccm or less.

In addition, when the reaction gas injection amount is less than 50 sccm, the remaining amount of the precursor composition, which is a reactant, may increase, thereby an inappropriate reaction may occur, and impurities may be generated. Thus, a thin film layer may be deposited non-uniformly. On the other hand, when the reaction gas injection amount is beyond 3000 sccm, impurities due to the reaction gas compound may be generated.

In yet another embodiment of the present disclosure, a purge gas injection time may be in a range of 1 second or more and 1 minute or less, and purge gas injection amounts of the purge gas may be in a range of 100 sccm or more and 4000 sccm or less.

For example, a purge gas injection time in the first purging may be in a range of 2 seconds or more and 55 seconds or less, 3 seconds or more and 50 seconds or less, 4 seconds or more and 45 seconds or less, 5 seconds or more and 40 seconds or less, 6 seconds or more and 35 seconds or less, 7 seconds or more and 28 seconds or less, 8 seconds or more and 21 seconds or less, and 9 seconds or more and 15 seconds or less.

The purge gas injection amounts may each independently be in a range of 100 sccm or more and 200 sccm or less, 100 sccm or more and 400 sccm or less, 100 sccm or more and 600 sccm or less, 100 sccm or more and 800 sccm or less, 100 sccm or more and 1000 sccm or less, 100 sccm or more and 1400 sccm or less, 100 sccm or more and 1800 sccm or less, 100 sccm or more and 2200 sccm or less, 100 sccm or more and 3600 sccm or less, 100 sccm or more and 3000 sccm or less, 100 sccm or more and 3300 sccm or less, 100 sccm or more and 3600 sccm or less, 100 sccm or more and 3900 sccm or less, 200 sccm or more and 3500 sccm or less, 300 sccm or more and 3000 sccm or less, 400 sccm or more and 2500 sccm or less, 500 sccm or more and 2400 sccm or less, 600 sccm or more and 1300 sccm or less, 700 sccm or more and 2200 sccm or less, 800 sccm or more and 2100 sccm or less, 900 sccm or more and 2000 sccm or less, 1000 sccm or more and 1900 sccm or less, 1100 sccm or more and 1800 sccm or less, 1200 sccm or more and 1700 sccm or less, and 1300 sccm or more and 1600 sccm or less.

In yet another embodiment of the present disclosure, a cycle repetition number may be in a range of 10 or more.

For example, the cycle repetition number may be in a range of 10 or more, 100 or more, 200 or more, 500 or more, 1,000 or more, 5,000 or more, 10,000 or more, 50,000 or more, 100,000 or more, and 1,000,000 or less.

When the process conditions for the reaction gas, process temperature, precursor composition, and purge gas are not satisfied, a thin film with excellent properties may not be obtained.

The thin film according to yet another aspect of the present disclosure may be manufactured by the method of manufacturing a thin film.

In yet another embodiment of the present disclosure, the thin film may have a refractive index (RI) in a range of 1.75 to 2.20. For example, the RI may be in a range of 1.85 to 2.15 or 1.95 to 2.10.

In yet another embodiment of the present disclosure, indium and gallium in the thin film ($In_xGa_yO_z$) analyzed by X-ray photoelectron spectroscopy (XPS) may have an atomic % ratio (x:y) in a range of 1:1 to 5:1. For example, the indium to gallium may have an atomic % ratio in a range of 1:1 to 5:1, 1.5:1 to 4.5:1, 1.8:1 to 4.2:1, or 2:1 to 4:1. That is, indium and gallium in the thin film of an indium gallium oxide may have an atomic % ratio the same as the molar ratio of the first compound and the second compound.

In yet another embodiment of the present disclosure, the thin film analyzed by X-ray photoelectron spectroscopy (XPS) may contain indium (In) in an amount of 25 atomic % or more and 43 atomic % or less, gallium (Ga) in an amount of 7 atomic % or more and 25 atomic % or less, and oxygen (O) in an amount of 44 atomic % or more and 56 atomic % or less.

In yet another embodiment of the present disclosure, as a result of analyzing the thin film using X-ray diffractometry (XRD), broad peaks, (211) peak, (222) peak, (431) peak, (440) peak, or (622) peak may appear.

In yet another embodiment of the present disclosure, the thin film analyzed by X-ray diffractometry (XRD) may have a phase nanocrystalline or polycrystalline.

In yet another embodiment of the present disclosure, the thin film analyzed by X-ray reflectometry (XRR) may have a density in a range of 6.0 g/cm$^3$ or more. For example, the density may be in a range of 6.1 g/cm$^3$ or more, 6.15 g/cm$^3$ or more, or 6.18 g/cm$^3$ or more. Additionally, the thin film may have a roughness in a range of 5 Å or more and 9.5 Å or less. For example, the roughness may be in a range of 5.6 Å or more and 9.2 Å or less, or 6.2 Å or more and 8.9 Å or less. The thin film may have excellent interfacial properties and corrosion resistance due to the surface properties and density of the thin film.

Hereinafter, the present disclosure will be described in more detail through examples. However, the following examples are intended to illustrate the present disclosure in more detail, and the scope of the present disclosure is not limited by the following examples.

SYNTHESIS EXAMPLES

Synthesis Example 1: Synthesis of Dimethylchloroindium ($In(CH_3)_2Cl$)

Trimethyl indium and pentane were placed in a Schlenk flask, and the temperature of the flask was cooled to a temperature of −20° C. Trichloro indium was slowly added to the solution and stirred for 30 minutes. Next, the temperature was gradually raised to room temperature, and the resulting solution was stirred to obtain dimethylchloroindium ($In(CH_3)_2Cl$).

The method of synthesizing dimethylchloroindium ($In(CH_3)_2Cl$) is as shown in Chemical Reaction 1 below.

[Chemical reaction 1]

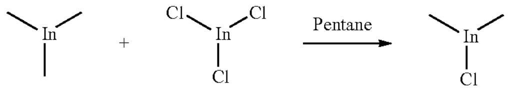

Synthesis Example 2: Synthesis of Dimethylchlorogallium($Ga(CH_3)_2Cl$)

Trimethyl gallium and pentane were placed in a Schlenk flask, and the temperature of the flask was cooled to a temperature of −20° C. Trichloro gallium was slowly added to the solution and stirred for 30 minutes. Next, the temperature was gradually raised to room temperature, and the resulting solution was stirred to obtain dimethylchlorogallium ($Ga(CH_3)_2Cl$).

The method of synthesizing dimethylchlorogallium($Ga(CH_3)_2Cl$) is as shown in Chemical Reaction 2 below.

[Chemical Reaction 2]

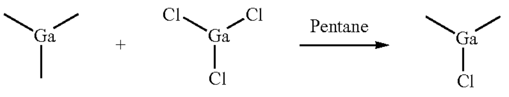

Synthesis Example 3: Synthesis of N-Tertbutyl-N',N'-Dimethylethane-1,2-Diamine Ligand 2-chloro-N,N-dimethylethylamine and water ($H_2O$) were placed in a flask and stirred to prepare a transparent aqueous solution. The flask was placed in a constant temperature water bath at a temperature of 20° C. After slowly adding tert-butylamine to the flask, the resulting solution was refluxed and stirred at a temperature of 70° C. for about 18 hours. Then, the flask was transferred to an ice bath and cooled. An aqueous NaOH solution was added to the flask and stirred for 10 minutes. After stirring, a compound was extracted using hexane, the solvent was removed under vacuum pressure. By doing so, N-tertbutyl-N',N'-dimethylethane-1,2-diamine was obtained. The synthesized N-tertbutyl-N',N'-dimethylethane-1,2-diamine was a transparent liquid compound at room temperature.

The method of synthesizing N-tertbutyl-N',N'-dimethylethane-1,2-diamine is as shown in Chemical Reaction 3 below.

[Chemical Reaction 3]

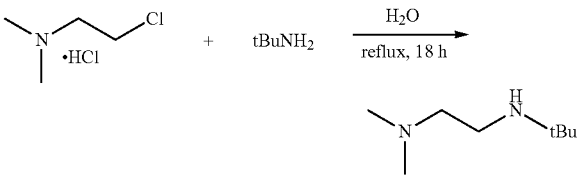

Synthesis Example 4: Synthesis of $In(CH_3)_2[(CH_3)_2NCH_2CH_2NtBu]$ Precursor Compound n-butyl lithium (2.5 M in hexane) was placed in a Schlenk flask. Next, the temperature of the flask was cooled to a temperature of −20° C. while N-tertbutyl-N',N'-dimethylethane-1,2-diamine (Synthesis Example 3) diluted in pentane or hexane was slowly added to the flask. After adding all of N-tertbutyl-N',N'-dimethylethane-1,2-diamine, the temperature of the flask was gradually raised to prepare a solution that was stirred at room temperature for 1 hour. After slowly adding the solution to dimethylchloroindium (Synthesis Example 1), the temperature of the flask was gradually raised, and the solution was stirred at room temperature for 18 hours. Then, the solid in the solution was filtered out, and the solvent was removed using a vacuum to obtain a light yellow liquid. The obtained liquid was vacuum distilled to obtain $In(CH_3)_2[(CH_3)_2NCH_2CH_2NtBu]$ precursor compound from which impurities were removed. The synthesized $In(CH_3)_2[(CH_3)_2NCH_2CH_2NtBu]$ precursor compound was a transparent liquid compound.

The method of synthesizing the $In(CH_3)_2[(CH_3)_2NCH_2CH_2NtBu]$ precursor compound is as shown in Chemical Reaction 4 below.

[Chemical Reaction 4]

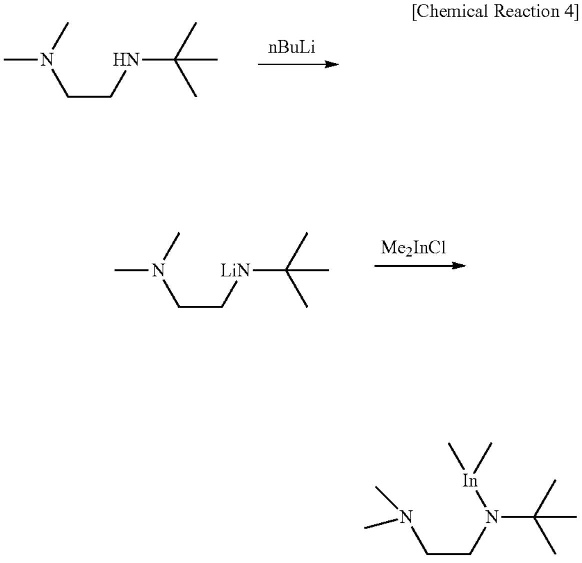

The NMR measurement result of the synthesized $In(CH_3)_2$ $[(CH_3)_2NCH_2CH_2NtBu]$ precursor compound was as follows.

1H-NMR (C6D6):

δ −0.06 (s, 6H), 1.32 (s, 9H), 1.65 (s, 6H), 2.19 (t, 2H), 3.00 (t, 2H)

Synthesis Example 5: Synthesis of $Ga(CH_3)_2[(CH_3)_2NCH_2CH_2NtBu]$ Precursor Compound n-butyl lithium (2.5 M in hexane) was placed in a Schlenk flask. Next, the temperature of the flask was cooled to a temperature of −20° C. while N-tertbutyl-N"N'-dimethylethane-1,2-diamine (Synthesis Example 3) diluted in pentane or hexane was slowly added to the flask. After adding all of N-tertbutyl-N',N'-dimethylethane-1,2-diamine, the temperature of the flask was gradually raised to prepare a solution that was stirred at room temperature for 1 hour. After slowly adding the solution to dimethylchlorogallium (Synthesis Example 2), the temperature of the flask was gradually raised, and the solution was stirred at room temperature for 18 hours. Then, the solid in the solution was filtered out, and the solvent was removed using a vacuum to obtain a light yellow liquid. The obtained liquid was vacuum distilled to obtain $Ga(CH_3)_2[(CH_3)_2NCH_2CH_2NtBu]$ precursor compound from which impurities were removed. The synthesized $Ga(CH_3)_2[(CH_3)_2NCH_2CH_2NtBu]$ precursor compound was a transparent liquid compound.

The method of synthesizing the $Ga(CH_3)_2[(CH_3)_2NCH_2CH_2NtBu]$ precursor compound is as shown in Chemical Reaction 5 below.

[Chemical Reaction 5]

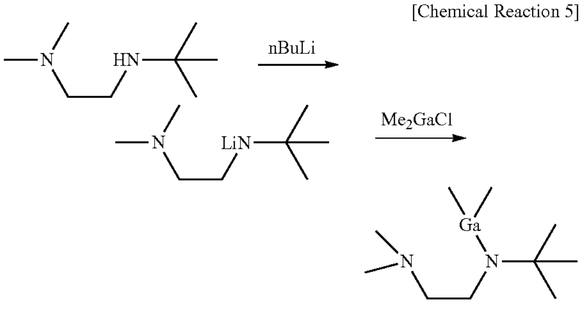

The NMR measurement result of the synthesized $Ga(CH_3)_2[(CH_3)_2NCH_2CH_2NtBu]$ precursor compound was as follows.

1H-NMR (C6D6):

δ −0.16 (s, 6H), 1.33 (s, 9H), 1.66 (s, 6H), 2.17 (t, 2H), 2.90 (t, 2H)

EXAMPLE

Example: Preparation of Composition $In(CH_3)_2[(CH_3)_2NCH_2CH_2NtBu]$ precursor compound (Synthesis Example 4) and $Ga(CH_3)_2[(CH_3)_2NCH_2CH_2NtBu]$ precursor compound (Synthesis Example 5) were mixed at a molar ratio of 3:1 to prepare a composition of Example.

PREPARATION EXAMPLES

Preparation Examples 1 to 3: Manufacturing of Indium Gallium Oxide Films Using Atomic Laver Deposition (ALD)

Indium gallium thin films ($In_xGa_yO_z$) were manufactured through atomic layer deposition (ALD) using the composition of Example ($In(CH_3)_2[(CH_3)_2NCH_2CH_2NtBu]$:$Ga(CH_3)_2[(CH_3)_2NCH_2CH_2NtBu]$=3:1).

A substrate used in these experiments was a boron-doped p-type silicon wafer with a 100 nm thick silicon oxide film deposited on the surface of the substrate. The silicon oxide film on the surface of the substrate was manufactured through a dry oxidation process.

Ozone ($O_3$) with a concentration of 200 g/$m^3$ was used as a reaction gas, the Ozone being generated from 1,000 sccm of oxygen gas. Argon (Ar), which was an inert gas, was used to serve as a carrier for the precursor and to purge a precursor and the reaction gas. A carrier argon had a flow rate of 300 sccm, and a purge argon had a flow rate of 1,500 sccm.

Preparation Example 1

(Precursor injection for x seconds)—(Purge gas injection for 10 seconds)—(Reaction gas injection for 12 seconds)—(Purge gas injection for 10 seconds) were carried out sequentially. This was done as one cycle.

In supplying the indium gallium mixed precursor composition of Preparation Example 1, the x seconds were set to 5 to 15 seconds. The process temperature was 100° C. or 280° C. The cycle number was set to 100. Through this, an indium gallium oxide film was deposited.

Specific process conditions are shown in Table 1 below.

TABLE 1

| Preparation Example | Precursor injection time (seconds) | Precursor purge time (seconds) | Reaction gas injection time (seconds) | Reaction gas purge time (seconds) | Process temperature (° C.) | Cycle number (cycles) |
|---|---|---|---|---|---|---|
| 1-1 | 5 | 10 | 12 | 10 | 100 | 100 |
| 1-2 | 7 | | | | | |
| 1-3 | 10 | | | | | |
| 1-4 | 12 | | | | | |
| 1-5 | 15 | | | | | |
| 1-6 | 5 | | | | 280 | |
| 1-7 | 7 | | | | | |
| 1-8 | 10 | | | | | |
| 1-9 | 12 | | | | | |
| 1-10 | 15 | | | | | |

In the manufacturing of the indium gallium oxide film of Preparation Example 1, a change in deposition rate depending on a change in precursor injection time is shown in FIG. 1(A).

As shown in FIG. 1(A), at a process temperature of 100° C., as the precursor injection time increased from 5 to 10 seconds, the deposition rate increased from 0.90 Å/cycle to 0.95 Å/cycle. After 10 seconds, the deposition rate was constant. Thus, the self-limited reaction which was a property of atomic layer deposition (ALD) was confirmed.

In addition, as shown in FIG. 1(A), at a process temperature of 280° C., when the precursor injection time was in a range of 5 to 7 seconds, the deposition rate was maintained at 0.91 Å/cycle to 1.02 Å/cycle. Thus, the self-limited reaction which was a property of atomic layer deposition (ALD) was confirmed.

Preparation Example 2

(Precursor injection for 10 seconds)—(Purge gas injection for 10 seconds)—(Reaction gas injection for y seconds)—(Purge gas injection for 10 seconds) were carried out sequentially. This was done as one cycle.

In supplying the reaction gas of Preparation Example 2, the y seconds were set to 7 to 15 seconds. The process temperature was 100° C. or 280° C. The cycle number was set to 100. Through this, an indium gallium oxide film was deposited.

Specific process conditions are shown in Table 2 below.

TABLE 2

| Preparation Example | Precursor injection time (seconds) | Precursor purge time (seconds) | Reaction gas injection time (seconds) | Reaction gas purge time (seconds) | Process temperature (° C.) | Cycle number (cycles) |
|---|---|---|---|---|---|---|
| 2-1 | 10 | 10 | 7 | 10 | 100 | 100 |
| 2-2 | | | 10 | | | |
| 2-3 | | | 12 | | | |
| 2-4 | | | 15 | | | |
| 2-5 | | | 7 | | 280 | |
| 2-6 | | | 10 | | | |
| 2-7 | | | 12 | | | |
| 2-8 | | | 15 | | | |

Figure 1B:
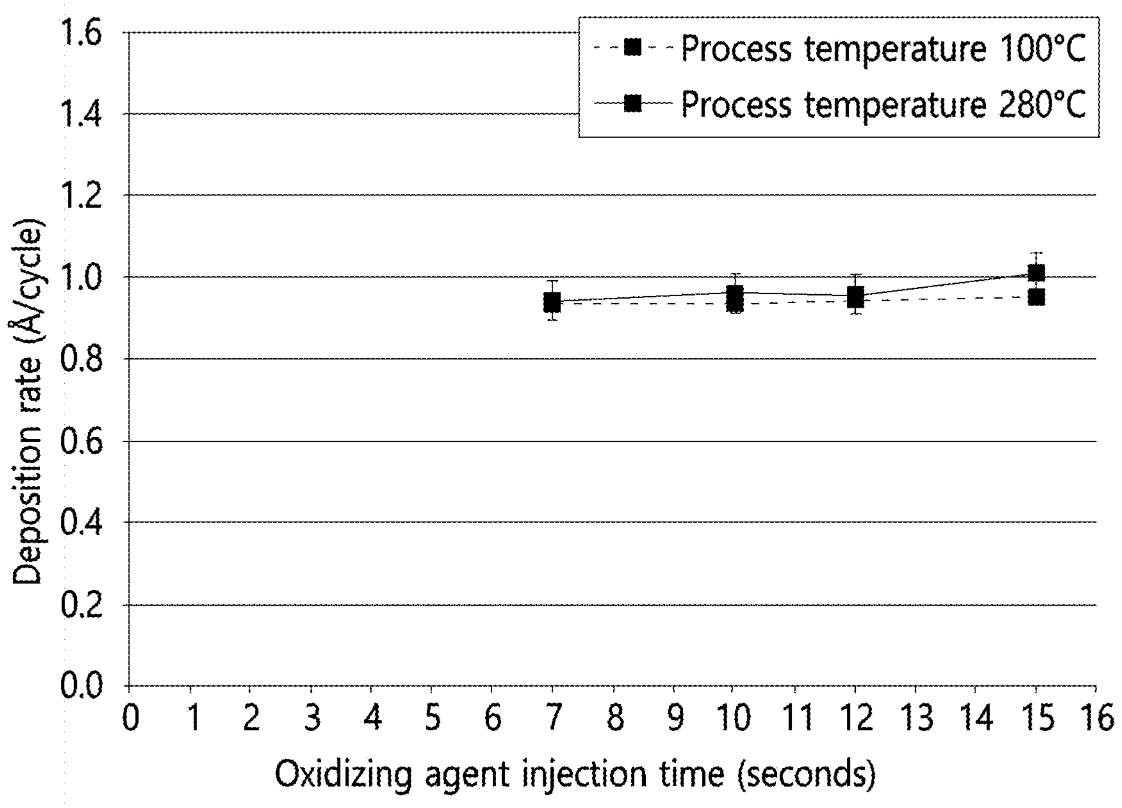
FIG. 1B is a graph showing a change in deposition rate depending on a change in reaction gas injection time in manufacturing the indium gallium oxide film of Preparation Example 2 of the present disclosure.

In the manufacturing of the indium gallium oxide film of Preparation Example 2, a change in deposition rate depending on a change in reaction gas injection time is shown in FIG. 1(B).

As shown in FIG. 1(B), at a process temperature of 100° C., when the precursor injection time was in a range of 7 to 15 seconds, the deposition rate was maintained at 0.93 Å/cycle to 0.96 Å/cycle. Thus, the self-limited reaction which was a property of atomic layer deposition (ALD) was confirmed.

In addition, as shown in FIG. 1(B), at a process temperature of 280° C., when the precursor injection time was in a range of 7 to 15 seconds, the deposition rate was maintained at 0.94 Å/cycle to 1.01 Å/cycle. Thus, the self-limited reaction which was a property of atomic layer deposition (ALD) was confirmed.

Preparation Example 3

(Precursor injection for 10 seconds)—(Purge gas injection for 10 seconds)—(Reaction gas injection for 12 seconds)—(Purge gas injection for 10 seconds) were carried out sequentially. This was done as one cycle.

The process temperature of Preparation Example 3 was in a range of 100° C. to 400° C. The cycle number was set to 100. Through this, an indium gallium oxide film was deposited.

Specific process conditions are shown in Table 3 below.

TABLE 3

| Preparation Example | Precursor injection time (seconds) | Precursor purge time (seconds) | Reaction gas injection time (seconds) | Reaction gas purge time (seconds) | Process temperature (° C.) | Cycle number (cycles) |
|---|---|---|---|---|---|---|
| 3-1 | 10 | 10 | 12 | 10 | 100 | 100 |
| 3-2 | | | | | 130 | |
| 3-3 | | | | | 160 | |
| 3-4 | | | | | 190 | |
| 3-5 | | | | | 220 | |
| 3-6 | | | | | 250 | |
| 3-7 | | | | | 280 | |
| 3-8 | | | | | 310 | |
| 3-9 | | | | | 340 | |
| 3-10 | | | | | 370 | |
| 3-11 | | | | | 400 | |

Figure 1C:
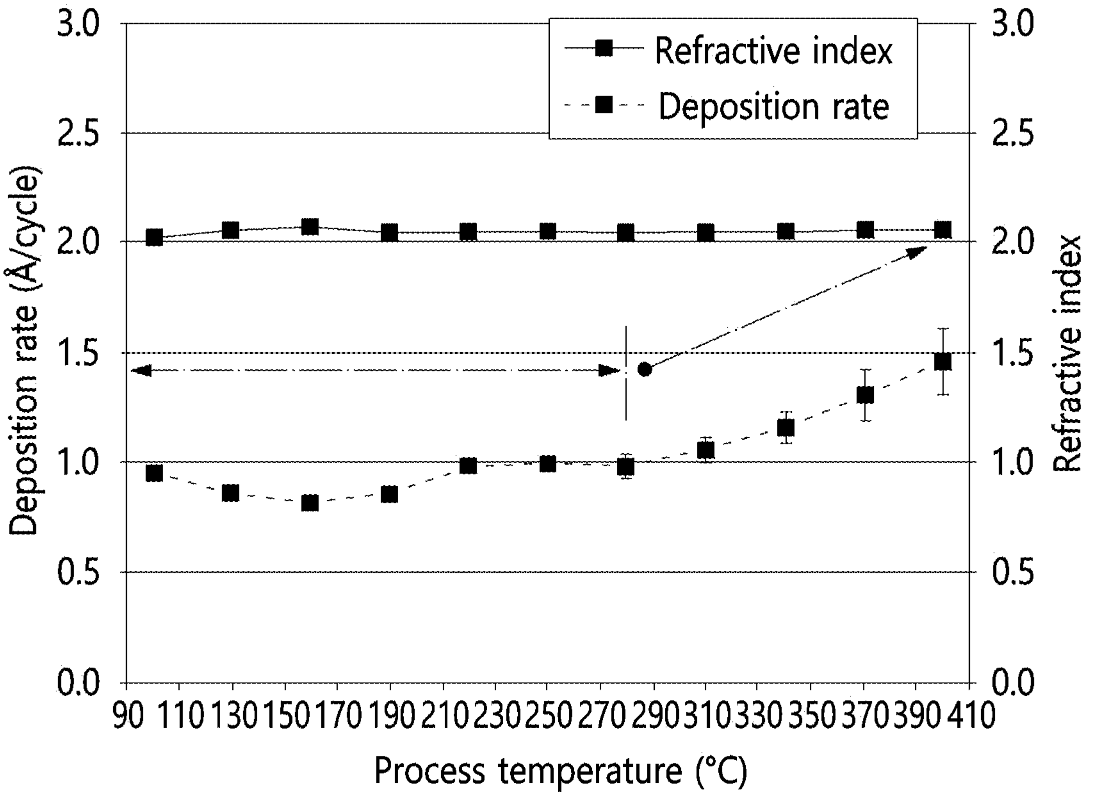
FIG. 1C is a graph showing a change in deposition rate depending on a change in process temperature of the composition in Example of the present disclosure.

In the manufacturing of the indium gallium oxide film of Preparation Example 3, the change in deposition rate depending on the change in process temperature is shown in FIG. 1(C).

As shown in FIG. 1(C), at a process temperature from 100° C. to 280° C., the deposition rate was maintained at 0.82 Å/cycle to 0.99 Å/cycle. It was confirmed that the ALD window (a temperature range in which the deposition rate was constant regardless of the process temperature within the range) was in a range of 100° C. to 280° C. when using the composition of Example. As the process temperature increased from 310° C. to 400° C., the deposition rate increased significantly from 1.06 Å/cycle to 1.46 Å/cycle.

It was confirmed that the refractive index was maintained at 2.05 regardless of the process temperature.

EVALUATION EXAMPLES

Evaluation Example 1: NMR Measurements

1H NMR of the composition of Example was measured using Varian 400 MHz.

Figure 2:
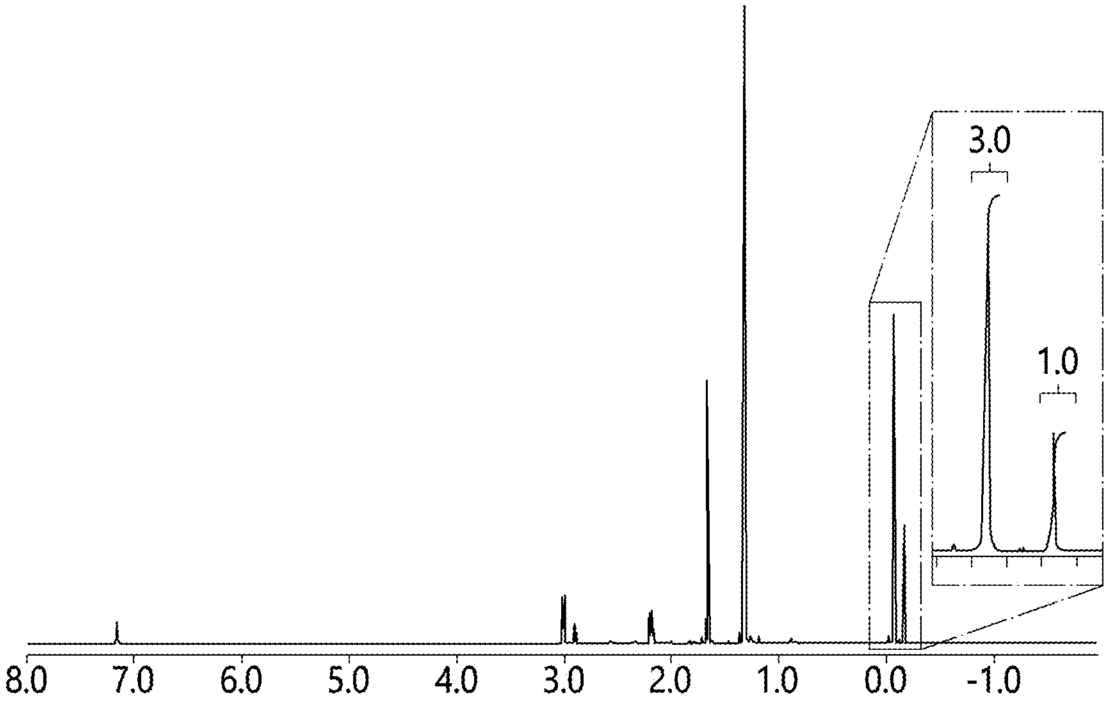
FIG. 2 is a graph showing an NMR measurement result of the composition in Example of the present disclosure.

As shown in FIG. 2, it was confirmed that, as a result of NMR measurement of the composition of the example, the ratio of Methyl H peak δ −0.06 (s, 6H) of indium (In) and Methyl H peak δ −0.16 (s, 6H) of gallium (Ga) was 3:1 the same as the molar ratio of Synthesis Example 4 compound and Synthesis Example 5 compound.

Evaluation Example 2: Thermogravimetric Analysis (TGA)

Thermogravimetric analysis of the composition of Example was performed using a TG209 F1 Libra instrument from Netzsch.

An alumina crucible with a capacity of 50 μL was used. The amount of all samples was 10 mg. Measurements were made by increasing the temperature from 30° C. to 500° C. at a rate of 10° C./min.

Figure 3:
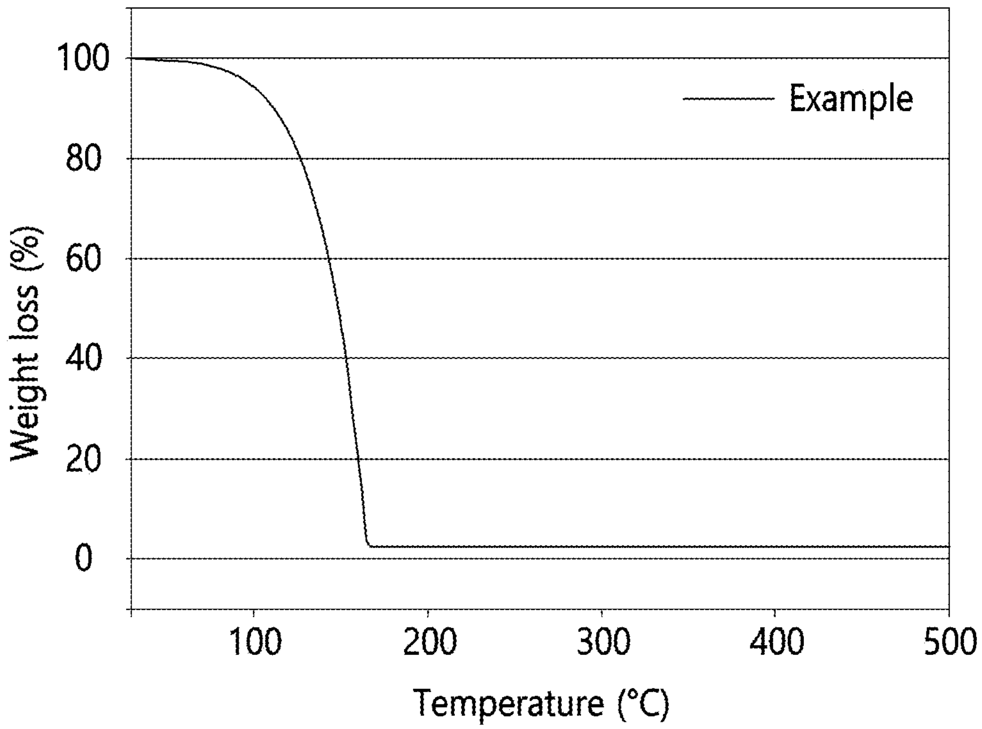
FIG. 3 is a graph showing an analysis result of the composition in Example of the present disclosure by thermogravimetric analysis (TGA)

The TGA measurement results of the composition of Example are shown in FIG. 3.

As a result of thermogravimetric analysis, as shown in FIG. 3, it was confirmed that the half-life (T1/2, ° C.) of the composition of Example was 161.9° C., the residual amount of the composition of Example at a temperature of 200° C. was 3.0 wt %, and the residual amount at a temperature of 300° C. was 1.8 wt %.

Evaluation Example 3: Composition Analysis of Oxide Film

The composition and impurity content of the indium gallium oxide film deposited using the composition of Example were analyzed through X-ray photoelectron spectroscopy (XPS).

Figure 4A:
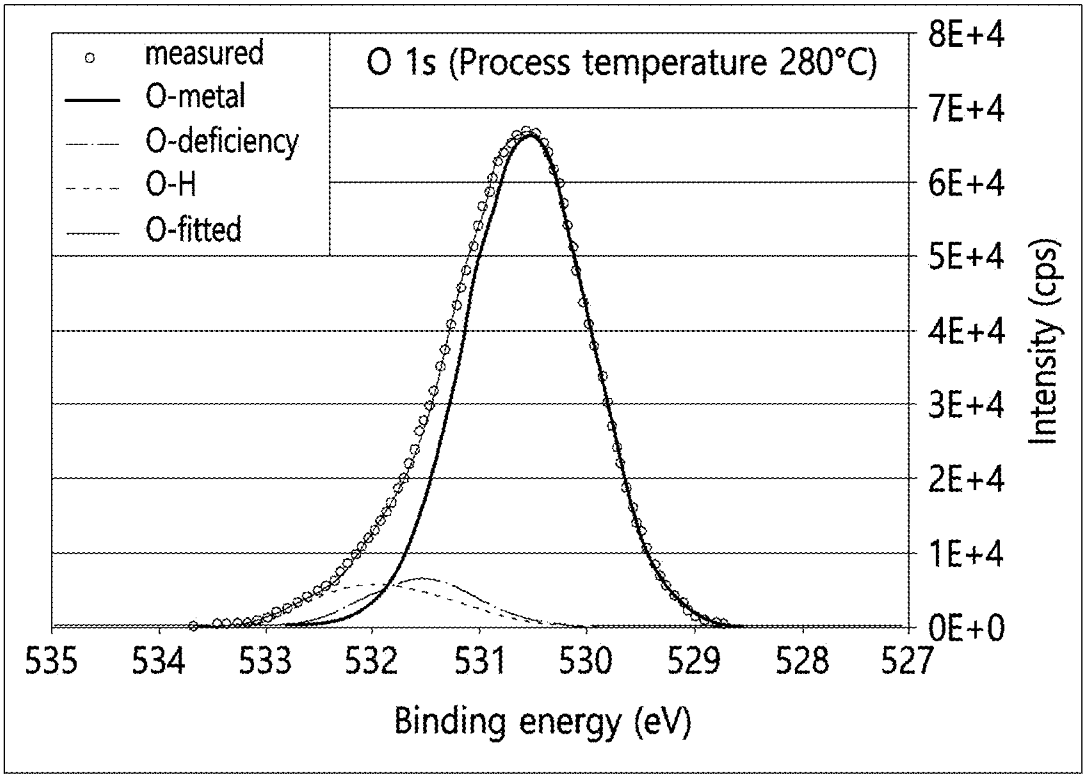
FIG. 4A is a graph and table showing the analysis results of a 20 nm thick indium gallium oxide film deposited at a process temperature of 280° C. by high-resolution X-ray photoelectron spectroscopy (High-Resolution XPS)
Figure 4B:
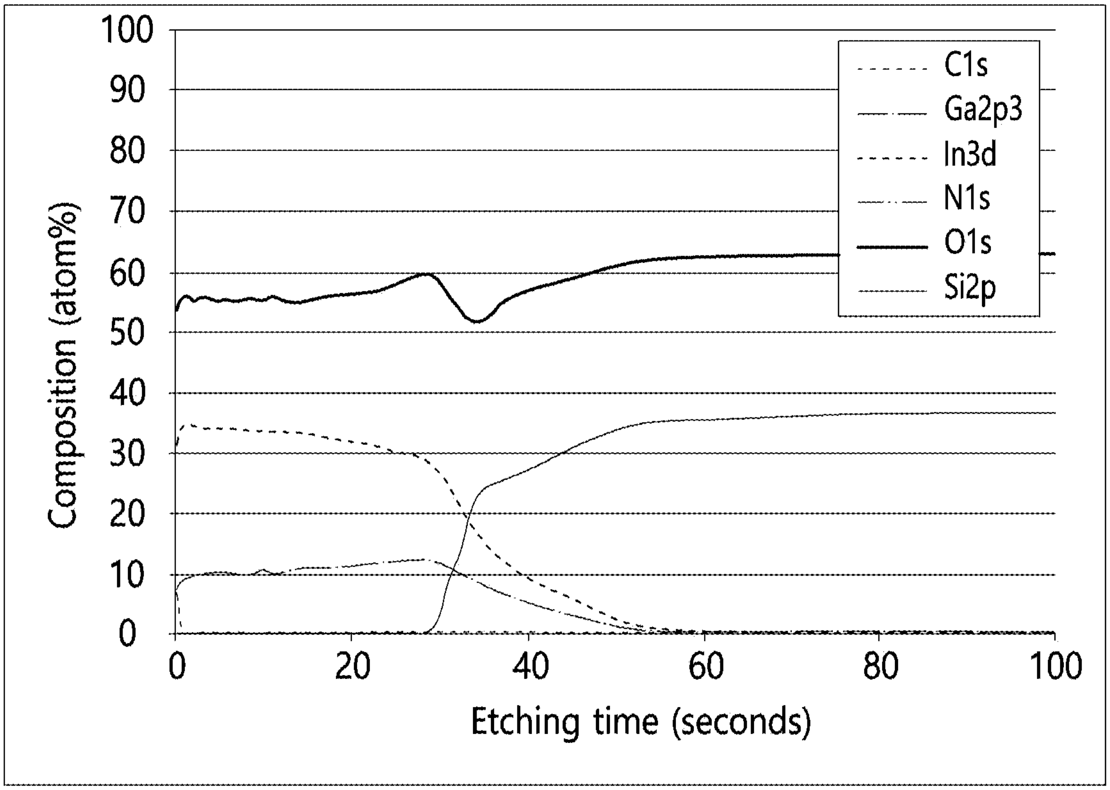
FIG. 4B is a graph and table showing the results of measuring the XPS depth profile of a 20 nm thick indium gallium oxide film deposited at a process temperature of 280° C.

The measurement results showing high-resolution XPS (FIG. 4(A)) and XPS depth profile (FIG. 4(B)) of the 20 nm thick indium gallium oxide film deposited at a process temperature of 280° C. are shown in FIG. 4.

As shown in FIG. 4(A), it was confirmed that, as a result of a high-resolution XPS scan, the ratio of indium to gallium in the indium gallium oxide film deposited using the composition of Example was 3.2:1. In addition, an oxygen-deficient bond was 4.3%, an oxygen-hydrogen bond was 8.9% meanwhile, an oxygen-metal (indium or gallium) bond was 86.8%. Thus, it was confirmed that oxygen was mostly combined with indium or gallium (O-Metal) rather than oxygen deficiency (O-deficiency) or with hydrogen (O—H).

In addition, as shown in FIG. 4(B), as a result of XPS depth profile measurement, indium (In) was 33.9 atomic %, gallium (Ga) was 10.5 atomic %, and oxygen (O) was 55.6 atomic %. On the other hand, impurities such as carbon, nitrogen, and hydrogen were not detected, and the ratio of oxygen to metal was 1.25.

In other words, it was confirmed that the ratio of indium and gallium atoms contained in the indium gallium oxide film manufactured in the ALD window matched the mixing ratio of the indium precursor compound (Synthesis Example 4) and the gallium precursor compound (Synthesis Example 5) in the composition. In addition, it was confirmed that the impurities (carbon, nitrogen, and hydrogen) contained in the indium gallium oxide film were at a negligible level.

Evaluation Example 4: Crystallinity and Density Analysis of Oxide Film

The crystallinity and density of the indium gallium oxide film deposited using the composition of Example were analyzed through X-ray diffractometry (XRD) and X-ray reflectometry (XRR).

Figure 5:
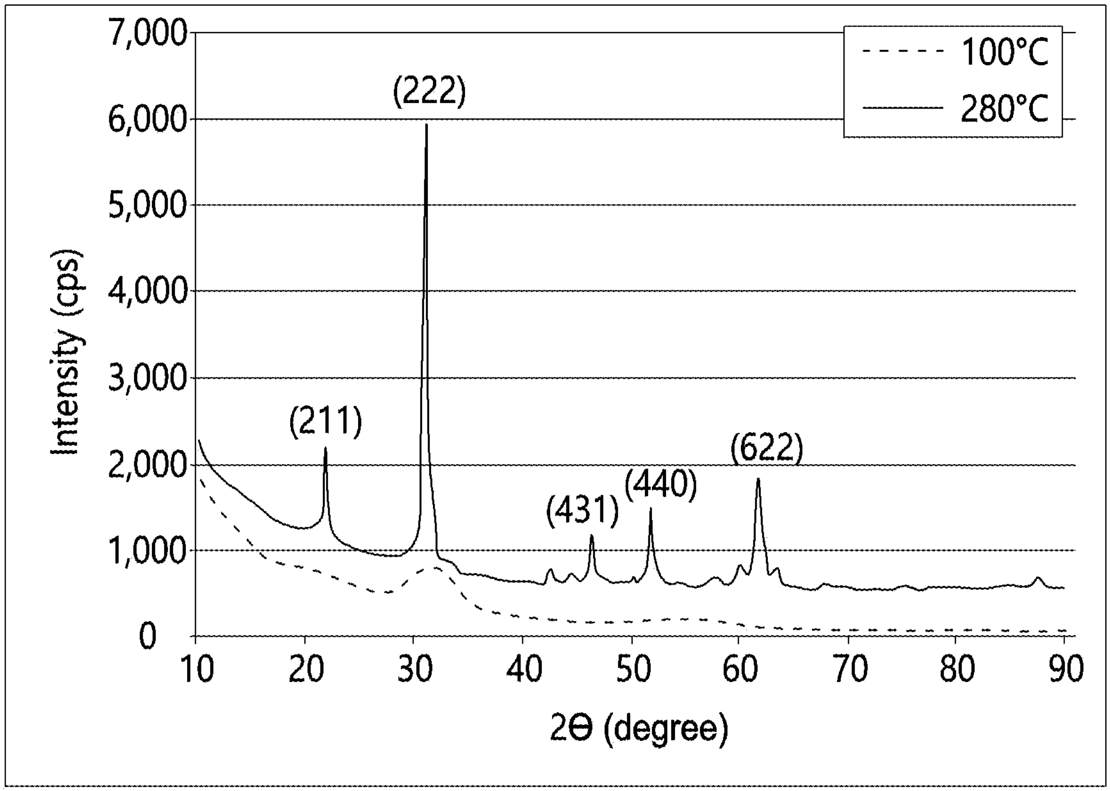
FIG. 5 is a graph and table showing analysis results of an indium gallium oxide film deposited at process temperatures of 100° C. and 280° C. using the composition in Example of the present disclosure by X-ray diffractometry (XRD)

The XRD analysis results of the indium gallium oxide film deposited using the composition of Example at process temperatures of 100° C. and 280° C. are shown in FIG. 5.

A wide peak appeared at a process temperature of 100° C. Accordingly, it was found that the microstructure of the oxide film was nanocrystalline, close to amorphous. In addition, at a process temperature of 280° C., several sharp peaks such as (211) peak, (222) peak, (431) peak, (440) peak, and (622) peak appeared. Accordingly, it was found that the microstructure of the oxide film was polycrystalline. As a result of checking the polycrystalline oxide film by referring to the ICDD card (00-006-0316), it was confirmed that the oxide film had a structure falling into a cubic Ia-3 space group.

Figure 6:
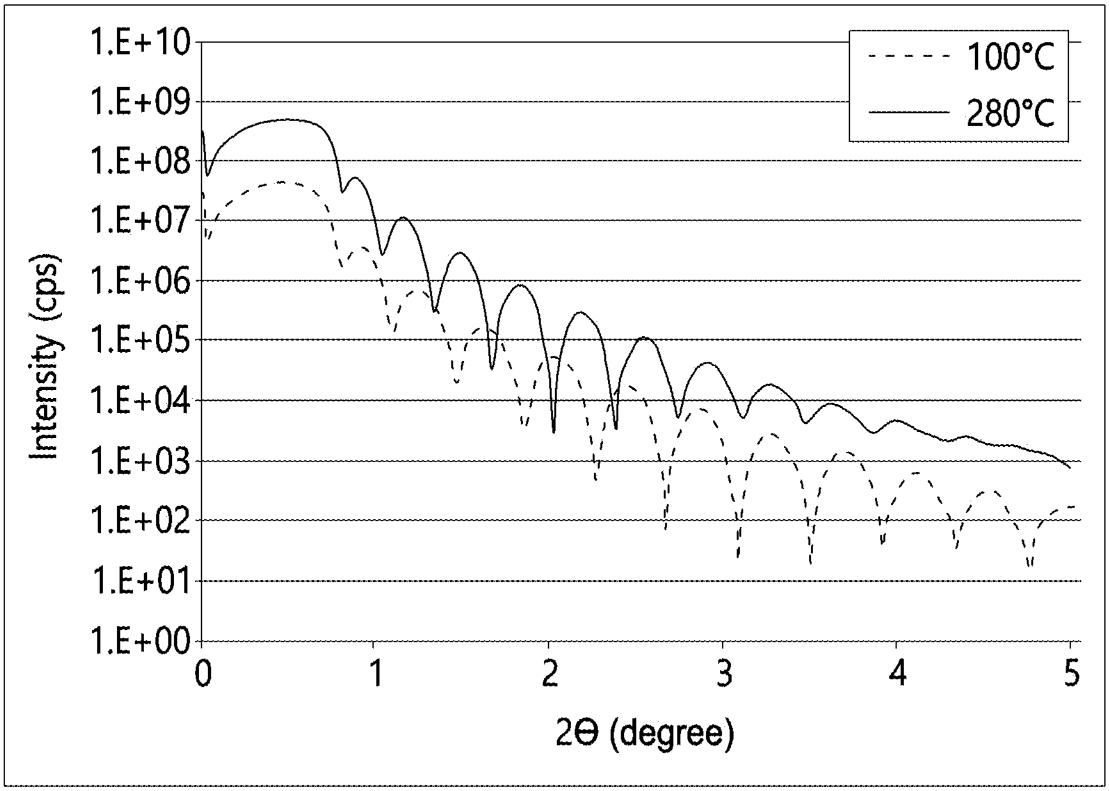
FIG. 6 is a graph and table showing analysis results of an indium gallium oxide film deposited at process temperatures of 100° C. and 280° C. using the composition in Example of the present disclosure by X-ray reflectometry (XRR)

The XRR analysis results of the indium gallium oxide film deposited using the composition of Example at process temperatures of 100° C. and 280° C. are shown in FIG. 6.

As shown in FIG. 6, it was confirmed that the oxide film deposited at a process temperature of 100° chad a density of 6.18 g/cm$^3$, and the oxide film deposited at a process temperature of 280° C. had a density of 6.88 g/m$^3$. In addition, it was confirmed that the oxide film deposited at a process temperature of 100° C. had a roughness of 6.31 Å, and the oxide film deposited at a process temperature of 280° C. had a roughness of 8.85 Å.

In other words, it was confirmed that as the process temperature increased, the crystallinity of the thin film increased and the density also increased, ultimately increasing the density of the thin film.

Evaluation Example 5: Step Coverage Analysis of Oxide Film

The step coverage of the indium gallium oxide film deposited using the composition of Example was analyzed through a transmission electron microscope (TEM) observation and energy dispersive X-ray spectrometry (EDS).

Figure 7A:
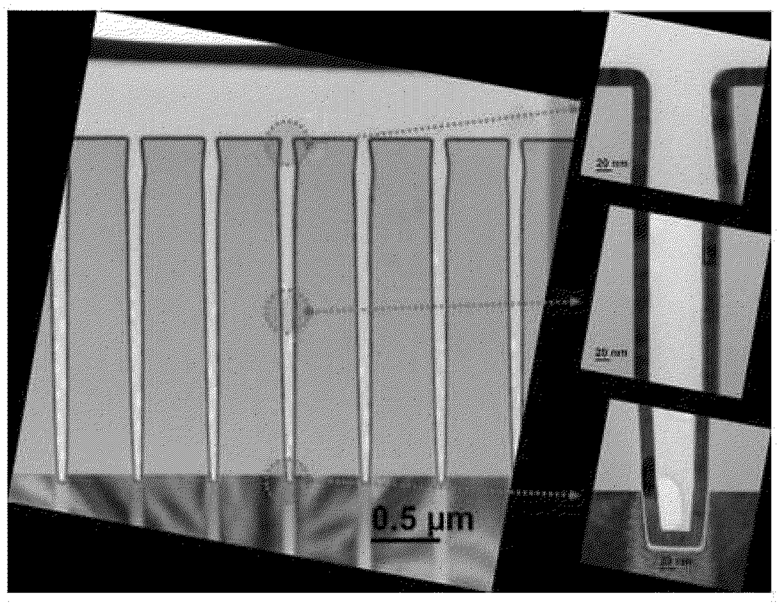
FIG. 7A is a photograph of an indium gallium oxide film deposited at a process temperature of 280° C. and manufactured in a trench structure with an aspect ratio of 40:1 using a transmission electron microscope.

FIG. 7(A) shows a TEM image of an indium gallium oxide film deposited at a process temperature of 280° C. and manufactured in a trench structure with an aspect ratio of 40:1.

As shown in FIG. 7(A), it was confirmed that the indium gallium oxide film deposited using the composition of Example had excellent step coverage.

Figure 7B:
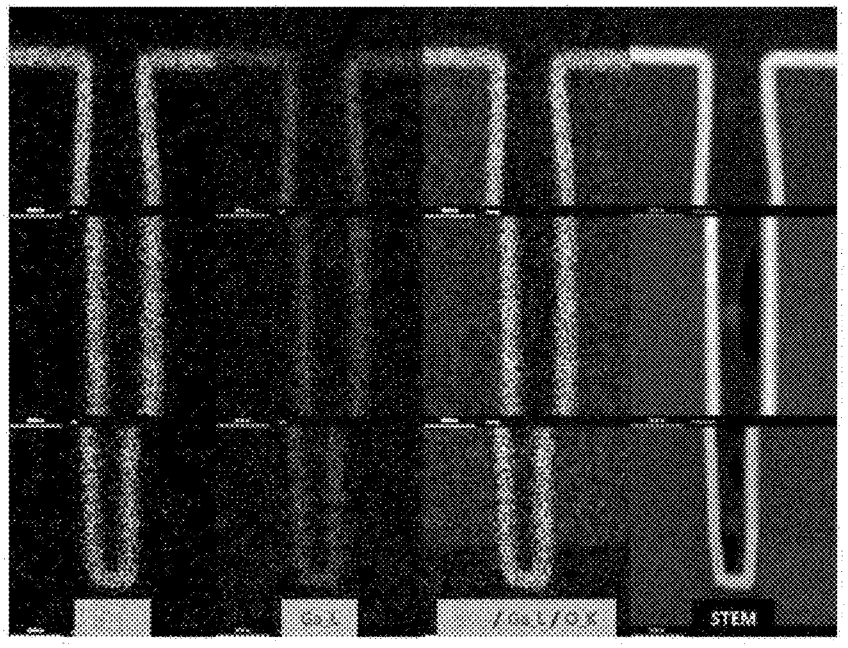
FIG. 7B is a photograph showing the mapping result of an indium gallium oxide film by energy dispersive X-ray spectrometry (EDS).

FIG. 7(B) shows the EDS mapping results of the indium gallium oxide film.

As shown in FIG. 7(B), it was confirmed that indium and gallium atoms were uniformly distributed in the indium gallium oxide film deposited using the composition of Example.

As seen above, it was confirmed that the composition of the present disclosure had excellent ALD properties. In addition, it was confirmed that, in the ALD window, the ratio of indium and gallium atoms in the indium gallium oxide film matched the mixing ratio of the indium precursor compound and gallium precursor compound in the composition, and almost no impurities existed in the thin film. In addition, it was confirmed that the oxide film even in a trench structure with an aspect ratio of 40:1 had excellent step coverage.

Because of these excellent properties, the thin film deposited using the composition of the present disclosure is expected to be used as an active layer of an oxide thin film transistor (TFT) in display devices in the future, and to be used as a channel in the manufacturing of memory semiconductors.

The scope of the present disclosure is indicated by the patent claims described below rather than the detailed description above. The meaning and scope of the patent claims, and all changes or modified forms derived from the equivalent concept thereof, should be construed as being included in the scope of the present disclosure.

What is claimed is:

1. A composition comprising a first compound represented by Formula 1 below and a second compound represented by Formula 2 below:

wherein the molar ratio of the first compound to the second compound comprised in the composition is in a range of 1:1 to 5:1,

[Formula 1]

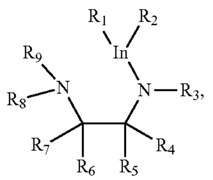

wherein in Formula 1, $R_1$ and $R_2$ are each independently hydrogen, a linear or a branched hydrocarbon group having 1 to 4 carbon atoms, $OR_{10}$, or $NR_{11}R_{12}$;

$R_3$, $R_8$, and $R_9$ are each independently hydrogen or a linear or a branched hydrocarbon group having 1 to 6 carbon atoms;

$R_4$ to $R_7$ are each independently hydrogen or a linear or a branched hydrocarbon group having 1 to 3 carbon atoms; and $R_{10}$ to $R_{12}$ are each independently hydrogen or a linear or a branched hydrocarbon group having 1 to 3 carbon atoms,

[Formula 2]

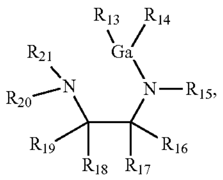

wherein in Formula 2, $R_{13}$ and $R_{14}$ are each independently hydrogen, a linear or a branched hydrocarbon group having 1 to 4 carbon atoms, $OR_{22}$, or $NR_{23}R_{24}$;

$R_{15}$, $R_{20}$, and $R_{21}$ are each independently hydrogen or a linear or a branched hydrocarbon group having 1 to 6 carbon atoms;

$R_{16}$ to $R_{19}$ are each independently hydrogen or a linear or a branched hydrocarbon group having 1 to 3 carbon atoms; and $R_{22}$ to $R_{24}$ are each independently hydrogen or a linear or a branched hydrocarbon group having 1 to 3 carbon atoms.

2. The composition of claim 1, wherein $R_1$, $R_2$, $R_{13}$, and $R_{14}$ each independently comprise any one selected from the group consisting of hydrogen, a methyl group, an ethyl group, an n-propyl group, an iso-propyl group, an n-butyl group, an iso-butyl group, a sec-butyl group, a tert-butyl group, a OH group, a OMe group, a OEt group, a OnPr group, a OiPr group, an $NH_2$ group, an NHMe group, an NHEt group, an NHnPr group, an NHiPr group, an $NMe_2$ group, an NMeEt group, an NMenPr group, an NMeiPr group, an $NEt_2$ group, an NEtnPr group, an NEtiPr group, an $NnPr_2$ group, an NnPriPr group, and an $NiPr_2$ group, (wherein, the Me is methyl, the Et is ethyl, the nPr is n-propyl, and the iPr is iso-propyl).

3. The composition of claim 1, wherein $R_3$, $R_8$, $R_9$, $R_{15}$, $R_{20}$, and $R_{21}$ each independently comprise any one selected from the group consisting of hydrogen, a methyl group, an ethyl group, an n-propyl group, an iso-propyl group, an n-butyl group, an iso-butyl group, a sec-butyl group, a tert-butyl group, an n-pentyl group, an iso-pentyl group, a neo-pentyl group, a sec-pentyl group, a tert-pentyl group, a hexyl group, an iso-hexyl group, and isomers thereof.

4. The composition of claim 1, wherein $R_4$ to $R_7$ and $R_{16}$ to $R_{19}$ each independently comprise any one selected from the group consisting of hydrogen, a methyl group, an ethyl group, an n-propyl group, and an iso-propyl group.

5. The composition of claim 1, wherein $R_{10}$ to $R_{12}$ and $R_{22}$ to $R_{24}$ each independently comprise any one selected from the group consisting of hydrogen, a methyl group, an ethyl group, an n-propyl group, and an iso-propyl group.

6. A vapor deposition precursor composition, comprising the composition of claim 1.

7. A method of manufacturing a thin film, the method comprising introducing the precursor composition of claim 6 into a chamber.

8. The method of claim 7, comprising atomic layer deposition (ALD) or chemical vapor deposition (CVD).

9. The method of claim 7, further comprising:

injecting a compound containing an oxygen (O) atom as a reaction gas, wherein the reaction gas is one or more selected from the group consisting of water vapor ($H_2O$), hydrogen peroxide vapor ($H_2O_2$), oxygen ($O_2$), a mixture of oxygen and hydrogen ($O_2$+$H_2$), and ozone ($O_3$).

* * * * *